United States Patent
Ueno et al.

(10) Patent No.: US 12,469,722 B2
(45) Date of Patent: Nov. 11, 2025

(54) SEMICONDUCTOR MANUFACTURING APPARATUS

(71) Applicant: Mitsubishi Electric Corporation, Tokyo (JP)

(72) Inventors: Masaki Ueno, Tokyo (JP); Kinya Yamashita, Tokyo (JP); Yasushi Takaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 385 days.

(21) Appl. No.: 17/814,446

(22) Filed: Jul. 22, 2022

(65) Prior Publication Data
US 2023/0197476 A1    Jun. 22, 2023

(30) Foreign Application Priority Data

Dec. 20, 2021  (JP) .................................. 2021-206231

(51) Int. Cl.
*B32B 43/00*        (2006.01)
*H01L 21/67*        (2006.01)

(52) U.S. Cl.
CPC ...... *H01L 21/67132* (2013.01); *B32B 43/006* (2013.01)

(58) Field of Classification Search
CPC .................... B32B 43/006; H10L 21/67132
See application file for complete search history.

(56) References Cited

U.S. PATENT DOCUMENTS

| | | | | |
|---|---|---|---|---|
| 4,556,362 A | * | 12/1985 | Bahnck | H01L 21/6835 414/935 |
| 6,709,543 B2 | * | 3/2004 | Kurosawa | H01L 21/67092 438/464 |
| 7,771,560 B2 | * | 8/2010 | Johnson | H01L 21/67092 156/707 |
| 2002/0019074 A1 | * | 2/2002 | Nakazawa | H01L 21/67132 438/107 |

(Continued)

FOREIGN PATENT DOCUMENTS

| | | |
|---|---|---|
| JP | 2012-164951 A | 8/2012 |
| JP | 2014-011416 A | 1/2014 |
| JP | 2019-047089 A | 3/2019 |

OTHER PUBLICATIONS

An Office Action; "Notice of Reasons for Refusal," mailed by the Japanese Patent Office on Oct. 29, 2024, which corresponds to Japanese Patent Application No. 2021-206231 and is related to U.S. Appl. No. 17/814,446; with English language translation.

*Primary Examiner* — Philip C Tucker
*Assistant Examiner* — Nickolas R Harm
(74) *Attorney, Agent, or Firm* — Studebaker Brackett PLLC

(57) ABSTRACT

According to the present disclosure, a semiconductor manufacturing apparatus comprises a pickup stage having a mechanism for lifting and lowering a semiconductor chip having a square shape. The pickup stage comprises first pushing-up blocks at four corners. Each of the first pushing-up blocks comprises a first side parallel to one side of the semiconductor chip, a second side parallel to another side of the semiconductor chip, and an offset portion formed between the first side and the second side to be offset to an inward side of an intersection point of respective extension lines of the first side and the second side.

16 Claims, 10 Drawing Sheets

(56) References Cited

U.S. PATENT DOCUMENTS

| | | | | |
|---|---|---|---|---|
| 2004/0115904 A1* | 6/2004 | Cheung | ............. | H01L 21/67092 |
| | | | | 438/464 |
| 2007/0293022 A1* | 12/2007 | Ko | .................... | H01L 21/67132 |
| | | | | 438/464 |
| 2013/0071956 A1* | 3/2013 | Nakajima | ......... | H01L 21/67132 |
| | | | | 228/49.5 |
| 2019/0295878 A1* | 9/2019 | Arai | .................. | H01L 21/67132 |
| 2020/0365430 A1* | 11/2020 | Negishi | ................ | H01L 21/681 |

* cited by examiner

SEMICONDUCTOR MANUFACTURING APPARATUS

BACKGROUND OF THE INVENTION

Field

The present disclosure relates to a semiconductor manufacturing apparatus used for detachment of a semiconductor chip from a dicing tape.

Background

JP 2012-164951 A discloses a technique for detaching a semiconductor chip from a dicing tape. In a dicing process as one of semiconductor manufacturing processes, the dicing tape is attached to a rear surface of a semiconductor substrate on which a plurality of semiconductor chips is collectively formed, and the semiconductor substrate is then cut. Then, each of the semiconductor chips is detached from the dicing tape, and is picked up.

However, in the above-described method, a block pushes up a corner of the semiconductor chip, resulting in a problem that detachment of the chip corner from the dicing tape does not easily progress.

SUMMARY

In view of the above-described problems, an object of the present disclosure is to provide a semiconductor manufacturing apparatus that facilitates progress in detachment of a corner of a semiconductor chip from a dicing tape.

The features and advantages of the present disclosure may be summarized as follows.

A semiconductor manufacturing apparatus according to the present disclosure includes: a pickup stage having a mechanism for lifting and lowering a semiconductor chip having a square shape, wherein the pickup stage comprises first pushing-up blocks at four corners thereof, and each of the first pushing-up blocks comprises a first side parallel to one side of the semiconductor chip, a second side parallel to another side of the semiconductor chip, and an offset portion formed between the first side and the second side to be offset to an inward side of an intersection point of respective extension lines of the first side and the second side.

Other and further objects, features and advantages of the disclosure will appear more fully from the following description.

DESCRIPTION OF EMBODIMENTS

First Embodiment

Figure 1:
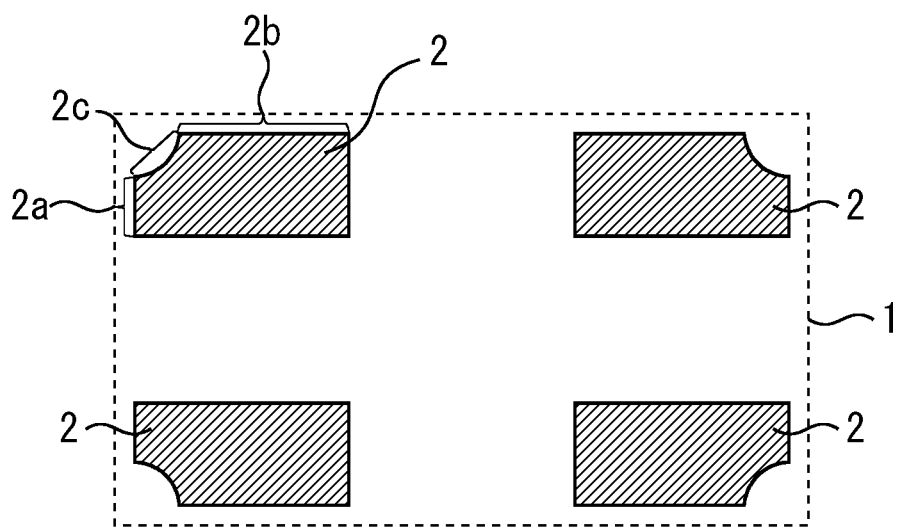
FIG. 1 is a plan view of a pushing-up block according to a first embodiment of the present disclosure.

FIG. 1 is a plan view of a pushing-up block according to a first embodiment of the present disclosure. For description, a mounting position of a semiconductor chip 1 is illustrated by an imaginary line. A corner portion pushing-up block 2 is positioned to push up each of four corners of the semiconductor chip 1, and has a first side 2a parallel to one side of the semiconductor chip 1 and a second side 2b parallel to another side of the semiconductor chip 1. The corner portion pushing-up block 2 includes an offset portion 2c formed to be offset to an inward side of an intersection point of respective extension lines of the first side 2a and the second side 2b.

The corner portion pushing-up block 2 pushes up the semiconductor chip 1 to be mounted at an inner position not overlapping its outer edge. The offset portion 2c is formed, when the intersection point of the respective extension lines of the first side 2a and the second side 2b is considered, to be concave to an inward side of a line segment connecting an end point on the intersection point side of the first side 2a and an end point on the intersection point side of the second side 2b. The offset portion 2c may be convex outward.

Detachment of the semiconductor chip 1 progresses from corner toward the center of the semiconductor chip 1. Therefore, when the chip corner is pushed up, like in a conventional configuration, a dicing tape is pressed against the chip corner by a pushing-up operation, resulting in a problem that detachment of the chip corner is inhibited. In a configuration according to the first embodiment, an upper surface of the corner portion pushing-up block 2 does not contact the chip corner and the chip sides. Thus, detachment of the semiconductor chip 1 can be advanced without inhibiting start of detachment from the dicing tape.

A force is applied in a direction in which the corner of the semiconductor chip 1 is cracked since the chip corner started to be detached until the chip corner finishes being detached.

Thus, a position proximate to a corner portion of the semiconductor chip 1 needs to be held to prevent the semiconductor chip 1 from being cracked. In the configuration according to the first embodiment, when both sides of the chip corner are pushed up by the same corner portion pushing-up block 2, both the sides of the chip corner can be uniformly held. Accordingly, detachment of the semiconductor chip 1 can be advanced without cracking and chipping the chip corner portion.

Since detachment of a central portion of each of the sides of the semiconductor chip 1 is slow, a force is applied so that the semiconductor chip 1 is easily cracked. Accordingly, if the semiconductor chip 1 has a shape of a rectangle two sides of which differ in length, the upper surface of the corner portion pushing-up block 2 is configured such that its side on the side parallel to the long side of the semiconductor chip 1 is long. Therefore, the central portion of the long side that is easily cracked can be sufficiently supported. Thus, a risk that the semiconductor chip 1 is cracked and chipped can be suppressed.

Figure 2:
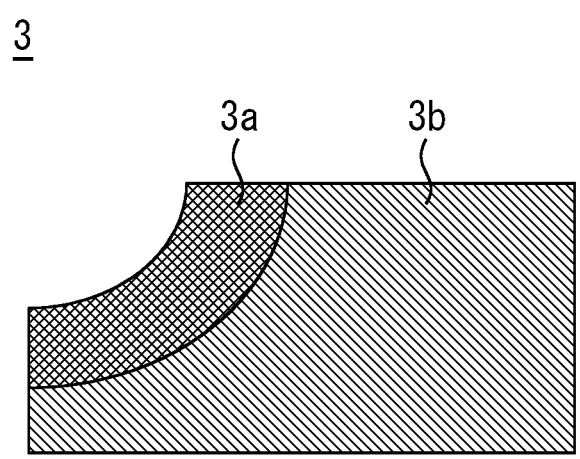
FIG. 2 is a plan view of a modification of the pushing-up block according to the first embodiment of the present disclosure.

FIG. 2 is a plan view of a modification of the pushing-up block according to the first embodiment of the present disclosure. A corner portion pushing-up block 3 according to the modification includes a contact plane 3*a* contacting a semiconductor chip 1 and an inclined plane 3*b* inclined to decrease in height toward the center of the semiconductor chip 1 from a line tangent to the contact plane 3*a*.

Figure 3:
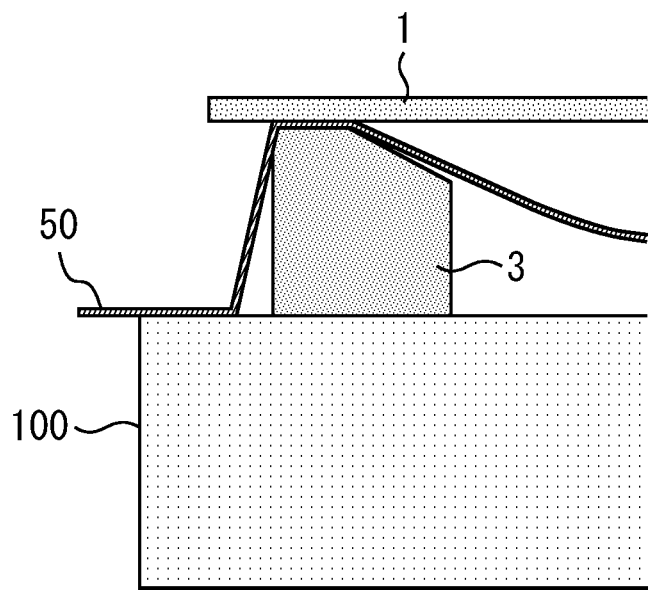
FIG. 3 is a cross-sectional view of a semiconductor pickup apparatus according to the first embodiment of the present disclosure.

FIG. 3 is a cross-sectional view of a semiconductor pickup apparatus according to the first embodiment of the present disclosure. FIG. 3 illustrates how the corner portion pushing-up block 3 has been cut to pass through the contact plane 3*a* and the inclined plane 3*b* illustrated in FIG. 2. The semiconductor pickup apparatus includes a pickup stage 100. The pickup stage 100 includes a corner portion pushing-up block 3 a distal end portion of which can be pushed up from its upper surface portion. The distal end portion of the corner portion pushing-up block 3 is projected from the pickup stage 100, to push up a dicing tape 50 from its lower surface. The semiconductor chip 1 individually separated by dicing is attached onto the dicing tape 50. Thus, in this case, the semiconductor chip 1 is pushed up, and detachment thereof from the dicing tape 50 is started.

After the corner portion pushing-up block 3 is pushed up, the contact plane 3*a* advances detachment of the semiconductor chip 1 without cracking and chipping the chip corner portion in a similar manner to that described for the corner portion pushing-up block 2. Since the corner portion pushing-up block 3 has the inclined plane 3*b*, sheet detachment progresses by wrapping not only from the chip corner portion and a peripheral portion of the semiconductor chip 1 but also around a space between the inclined plane 3*b* and the semiconductor chip 1. As a result, the corner portion pushing-up block 3 having the inclined plane 3*b* can more quickly advance sheet detachment.

The corner portion pushing-up block 3 may have an uneven shape by including a concave portion formed by a slit on the contact plane 3*a* and a convex portion formed by a spherical or needle-shaped member. When the corner portion pushing-up block 3 has an uneven shape on its surface, a space occurs between a sheet and the semiconductor chip 1. Thus, sheet detachment can be more quickly advanced.

The pickup stage 100 may have a suction groove and a suction hole on its surface contacting the semiconductor chip 1, and an edge portion of the suction groove may have a structure that has been R-face or C-face chamfering-finished. In this case, the pickup stage 100 has a mechanism for sucking the dicing tape 50, and has a function of enabling detachment to be easily advanced by sucking the dicing tape 50 when pushing up the semiconductor chip 1. The pickup stage 100 may have a configuration in which suction pressure of a suction mechanism is changeable.

Second Embodiment

Figure 4:
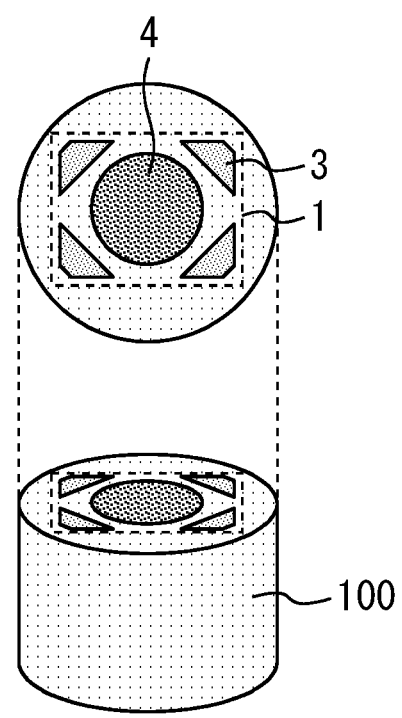
FIG. 4 is a diagram illustrating a configuration of a pushing-up block according to a second embodiment of the present disclosure.

FIG. 4 is a diagram illustrating a configuration of a pushing-up block according to a second embodiment of the present disclosure. An upper diagram is a plan view, and a lower diagram is a perspective view. The second embodiment includes a central portion pushing-up block 4 in addition to a corner portion pushing-up block 3.

While detachment from a dicing tape 50 progresses, when only a corner portion of a semiconductor chip 1 is pushed up, like in the first embodiment, a force is applied to a central portion of each of sides of the semiconductor chip 1 so that the semiconductor chip 1 may be cracked and chipped. The central portion pushing-up block 4 pushes up the semiconductor chip 1 while detachment from the dicing tape 50 progresses to the central portion from the corner portion of the semiconductor chip 1. Therefore, the vicinity of the central portion of each of the sides of the semiconductor chip 1 is supported, whereby the semiconductor chip 1 can be prevented from being cracked and chipped.

The corner portion pushing-up block 3 and the central portion pushing-up block 4 in the second embodiment may respectively have lifting and lowering mechanisms that separately operate. An operation for the corner portion pushing-up block 3 to push up the semiconductor chip 1 does not inhibit detachment of the chip corner from the dicing tape 50 but inhibits the detachment around the chip corner to be supported. The above-described lifting and lowering mechanism stops raising or starts to lower the corner portion pushing-up block 3 when detachment of the corner portion of the semiconductor chip 1 from the dicing tape 50 is started. Therefore, the corner portion pushing-up block 3 is lower than the central portion pushing-up block 4. Thus, the chip corner portion is easily detached from the dicing tape 50, and detachment toward the center of the semiconductor chip 1 from the dicing tape 50 progresses.

The pickup stage 100 has a structure for raising a block with a hole. When attachment portions are made to have the same shape, respectively, for a plurality of corner portion pushing-up blocks 3, the corner portion pushing-up blocks 3 can be respectively installed in any places of the pickup stage 100. Thus, a reduction in cost due to a reduction in the number of types of components can be implemented. If even the attachment portions are common, the size of the block itself is changeable. Thus, even when the respective sizes of the semiconductor chips 1 differ from one another, the difference can be coped with if the block is replaced. Even in this respect, a reduction in cost can also be achieved.

Figure 5:
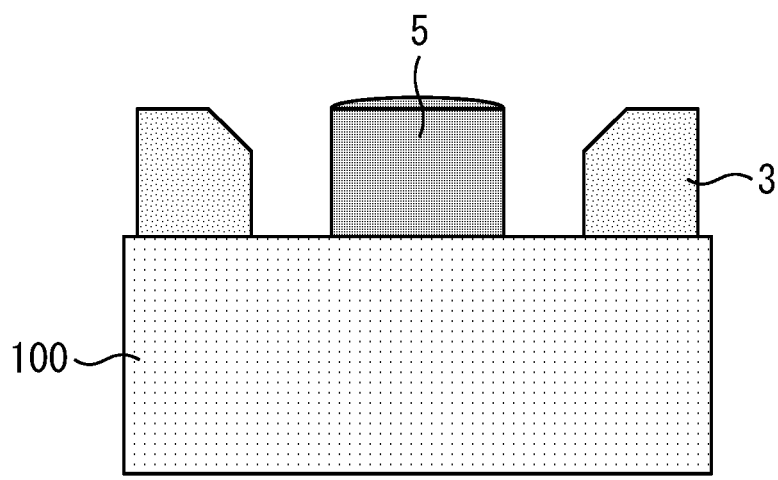
FIG. 5 is a front view illustrating a modification of the central portion pushing-up block according to the second embodiment of the present disclosure.

FIG. 5 is a front view illustrating a modification of the central portion pushing-up block according to the second embodiment of the present disclosure. The modification includes a central portion pushing-up block 5 having an upper surface that is not a flat surface but a curved surface the center of which is the highest. If the upper surface is a flat surface, a force is applied to the outer periphery of the upper surface in a concentrated manner. However, if the upper surface is a curved surface, the force is dispersed, whereby a semiconductor chip 1 can be prevented from being cracked and chipped. The central portion pushing-up block 5 has a shape in which its central portion is the highest, thereby making it difficult for preventing from detachment a dicing tape to progress toward the center from the outer periphery of the semiconductor chip 1.

Figure 6:
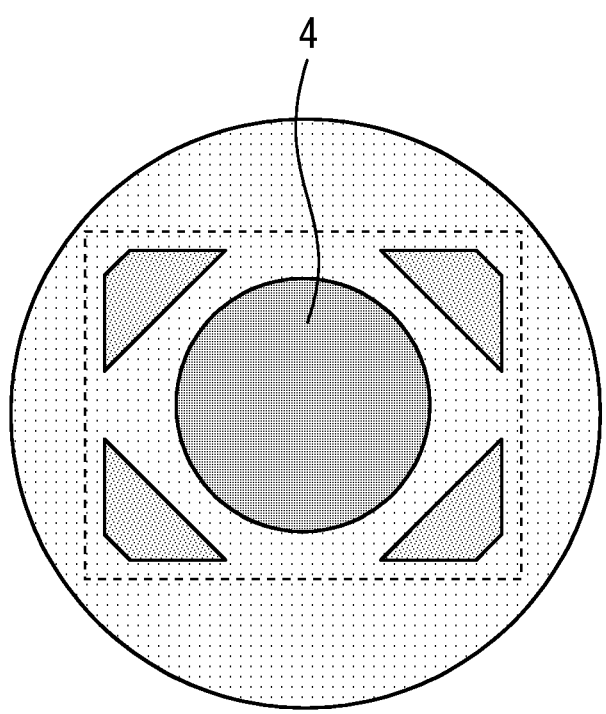
FIG. 6 is a plan view of the central portion pushing-up block according to the second embodiment of the present disclosure.

FIG. 6 is a plan view of the central portion pushing-up block according to the second embodiment of the present disclosure. The central portion pushing-up block 4 has an upper surface that is circular when seen in a plan view.

Figure 7:
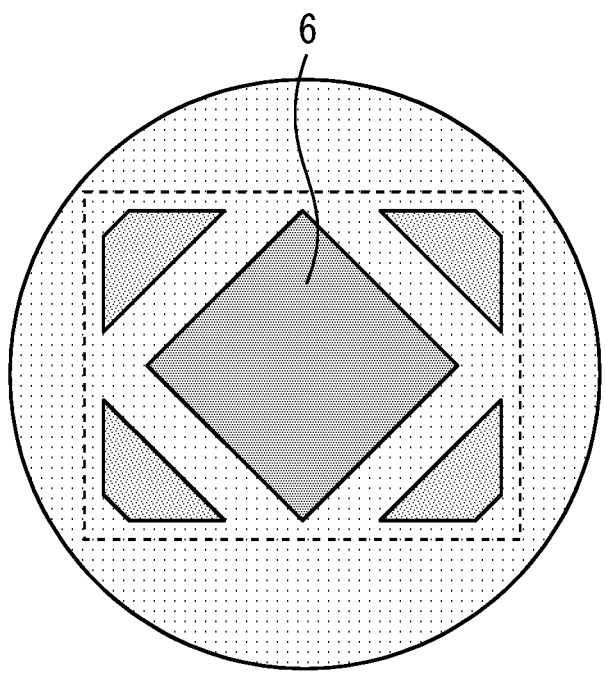
FIG. 7 is a plan view illustrating a modification of the central portion pushing-up block according to the second embodiment of the present disclosure.

FIG. 7 is a plan view illustrating a modification of the central portion pushing-up block according to the second embodiment of the present disclosure. The modification includes a central portion pushing-up block 6 having an upper surface that is rhomboidal when seen in a plan view.

Figure 8:
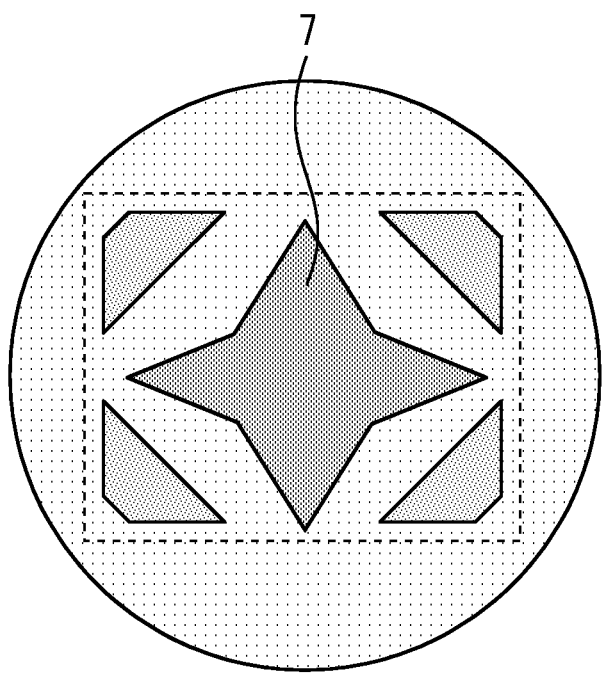
FIG. 8 is a plan view illustrating a modification of the central portion pushing-up block according to the second embodiment of the present disclosure.

FIG. 8 is a plan view illustrating a modification of the central portion pushing-up block according to the second embodiment of the present disclosure. The modification includes a central portion pushing-up block 7 having an upper surface that is cruciform when seen in a plan view. A cruciform shape herein mentioned refers to a shape obtained by removing from a rhomboidal shape four isosceles triangles, which do not overlap one another, with four sides forming the rhomboidal shape, respectively, as their bottom sides.

The second embodiment may have a shape in which the vicinity of a central portion of each of sides of the semiconductor chip 1 can be supported for the purpose of dispersing a force to be applied to the vicinity of the central portion of the side. Accordingly, the central portion pushing-up block may be pushing-up blocks respectively having rhomboidal-shaped and cruciform-shaped upper surfaces, like the central portion pushing-up blocks 6 and 7.

Third Embodiment

Figure 9:
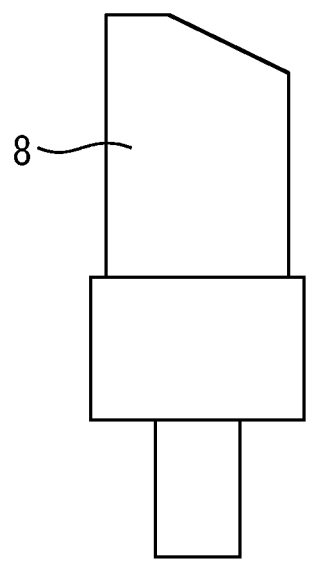
FIG. 9 is a front view illustrating a configuration of a pushing-up block according to a third embodiment of the present disclosure.
Figure 10:
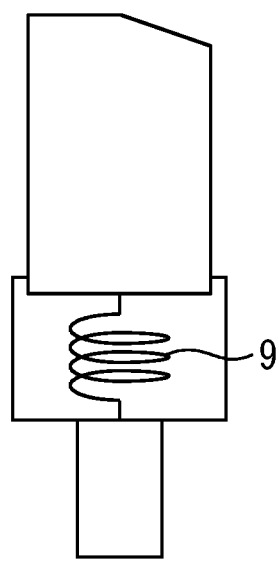
FIG. 10 is a cross-sectional view illustrating a configuration of the pushing-up block according to the third embodiment of the present disclosure.

FIG. 9 is a front view illustrating a configuration of a pushing-up block according to a third embodiment of the present disclosure, and FIG. 10 is a cross-sectional view illustrating a configuration of the pushing-up block according to the third embodiment of the present disclosure. A corner portion pushing-up block 8 according to the third embodiment has an elastic mechanism such as a spring 9 in an inner portion thereof, as illustrated in FIG. 10.

Figure 11:
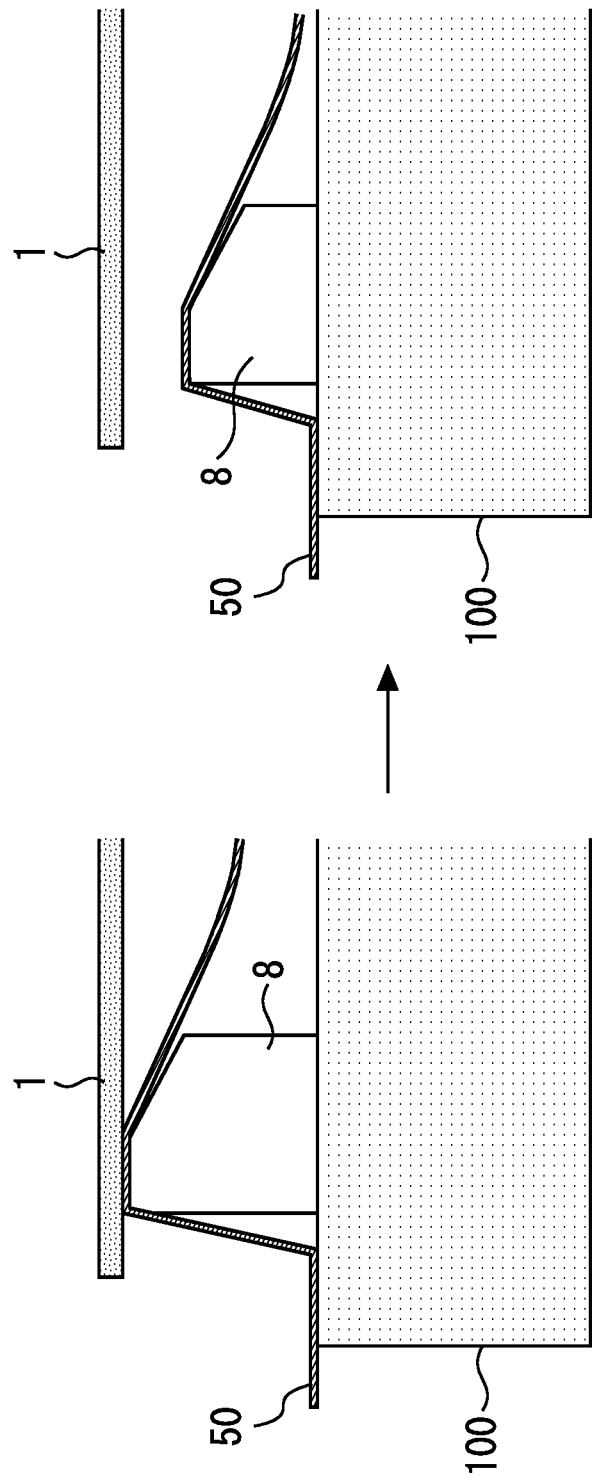
FIG. 11 is a diagram illustrating an operation of the pushing-up block according to the third embodiment of the present disclosure.

FIG. 11 is a diagram illustrating an operation of the pushing-up block according to the third embodiment of the present disclosure. FIG. 11 illustrates how detachment from a dicing tape 50 progresses sequentially from a left diagram to a right diagram. As the spring 9 in the third embodiment, a spring having a smaller restoration force than a restoration force of the dicing tape 50 immediately before detachment is selected. Accordingly, in early stages of a pushing-up operation, the corner portion pushing-up block 8 pushes up a semiconductor chip 1, as in the left diagram. However, in late stages of the pushing-up operation, the restoration force of the dicing tape 50 is above the restoration force of the spring 9. Accordingly, the corner portion pushing-up block 8 sinks toward a pickup stage 100 for being pushed back by dicing tape 50 as in the right diagram. At the time, the semiconductor chip 1 and the dicing tape 50 are detached from each other.

For the action of the above-described spring, even when the corner portion pushing-up block 8 and a central portion pushing-up block 4 are collectively driven by one lifting and lowering mechanism, the corner portion pushing-up block 8 and the central portion pushing-up block 4 can be respectively made to perform separate operations. Accordingly, a reduction in cost of an apparatus can be implemented.

Fourth Embodiment

Figure 12:
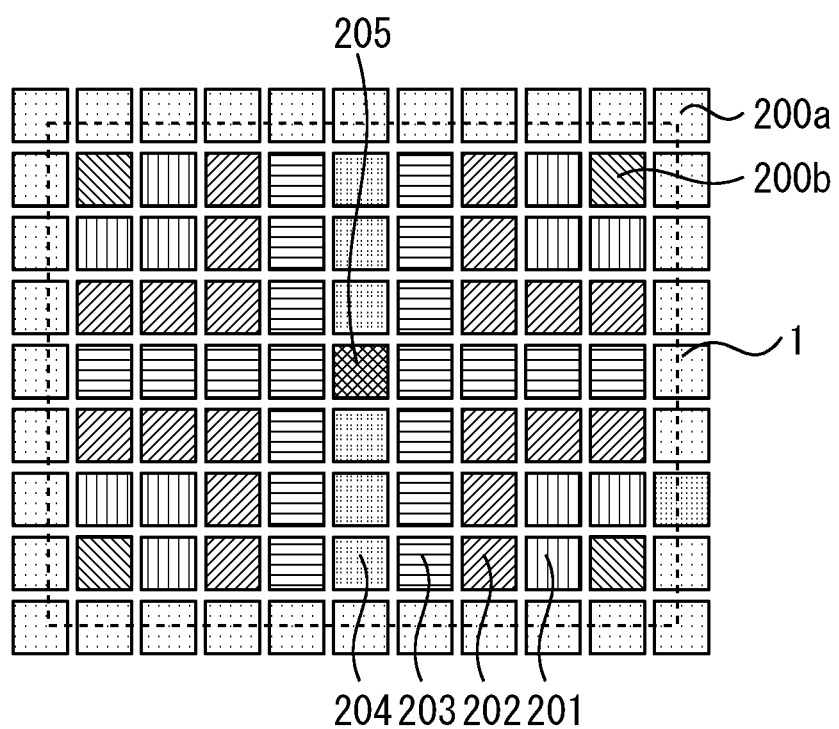
FIG. 12 is a plan view of a pushing-up block according to a fourth embodiment of the present disclosure.

FIG. 12 is a plan view of a pushing-up block according to a fourth embodiment of the present disclosure. For description, a mounting position of a semiconductor chip 1 is illustrated by an imaginary line. The fourth embodiment includes a plurality of pushing-up blocks arranged in a lattice shape and respectively having upper surfaces that are the same in shape. The blocks respectively contacting the peripheries of sides and corner portions of the semiconductor chip 1 are not used, but only the blocks inside the blocks not to be used and contacting the semiconductor chip 1 are used, to detach the semiconductor chip 1 from a dicing tape 50. In FIG. 12, blocks 200a contact each of the sides of the semiconductor chip 1, and blocks 200b respectively contact the corner portions of the semiconductor chip 1. Thus, blocks 201, 202, 203, 204, and 205 inside the blocks 200a and 200b are used.

The above-described plurality of pushing-up blocks respectively have lifting and lowering mechanisms that separately operate, and sequentially operate such that they increase in height toward the inner side. In a case illustrated in FIG. 12, the blocks 201, 202, 203, 204, and 205 are simultaneously pushed up. After a predetermined time period, the block 201 stops pushing up, and the remaining blocks 202, 203, 204, and 205 continue to push up. Further, after a predetermined time period, the block 202 stops pushing up, and the remaining blocks 203, 204, and 205 continue to push up. When the blocks stop pushing up in ascending order of distances from the chip corner portions, the blocks on the inner side are relatively high, whereby detachment from a dicing tape can be smoothly promoted.

In this form, even when the size of the semiconductor chip has changed, the change can be coped with by only changing the blocks to be used. That is, one semiconductor manufacturing apparatus can be applied to the respective semiconductor chips 1 of a plurality of sizes, thereby making it possible to expect a reduction in the number of components and simplification of management.

Figure 13:
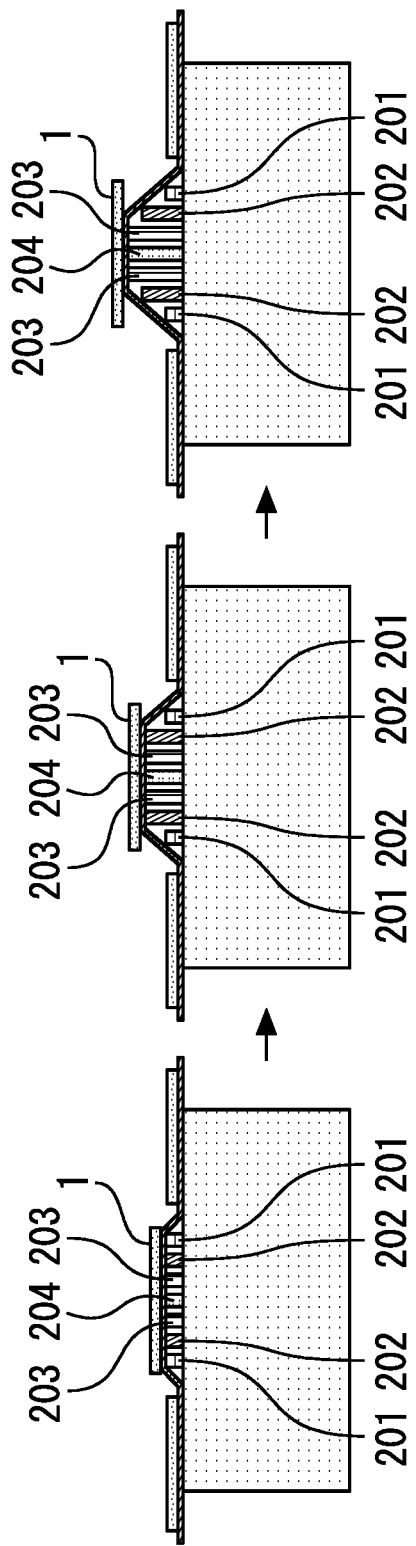
FIG. 13 is a front view illustrating the progress of detachment from the dicing tape according to the fourth embodiment of the present disclosure.

FIG. 13 is a front view illustrating the progress of detachment from the dicing tape according to the fourth embodiment of the present disclosure. In FIG. 13, the same semiconductor manufacturing apparatus as that illustrated in FIG. 12 is viewed from the front. Thus, the blocks 200a and 200b that have not been used for pushing-up are not seen because they are within the pickup stage 100, and only the blocks 201, 202, 203, 204 that have been used for pushing-up are seen.

First, the blocks 201, 202, 203, and 204 are pushed up in cooperation, as in a left diagram. After detachment of an end portion of the semiconductor chip 1 is started, the block 201 positioned on the outermost side among the blocks pushed up stops rising, and the other blocks 202, 203, and 204 continue to rise, as in a middle diagram. After the detachment further progresses, the block 202 positioned on the outermost side among the blocks pushed up stops rising, and the other blocks 203, and 204 continue to rise, as in a right diagram. When this is repeated, detachment from the dicing tape can be smoothly advanced while a central portion of the semiconductor chip 1 is supported to prevent the semiconductor chip 1 from being cracked and chipped.

Figure 14:
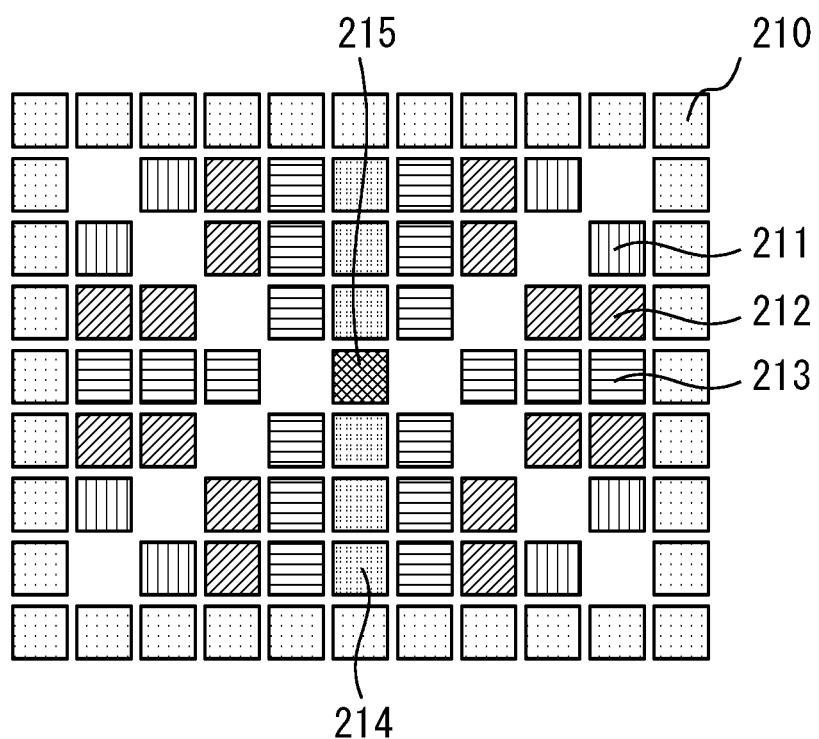
FIG. 14 is a plan view illustrating a modification according to the fourth embodiment of the present disclosure.
Figure 15:
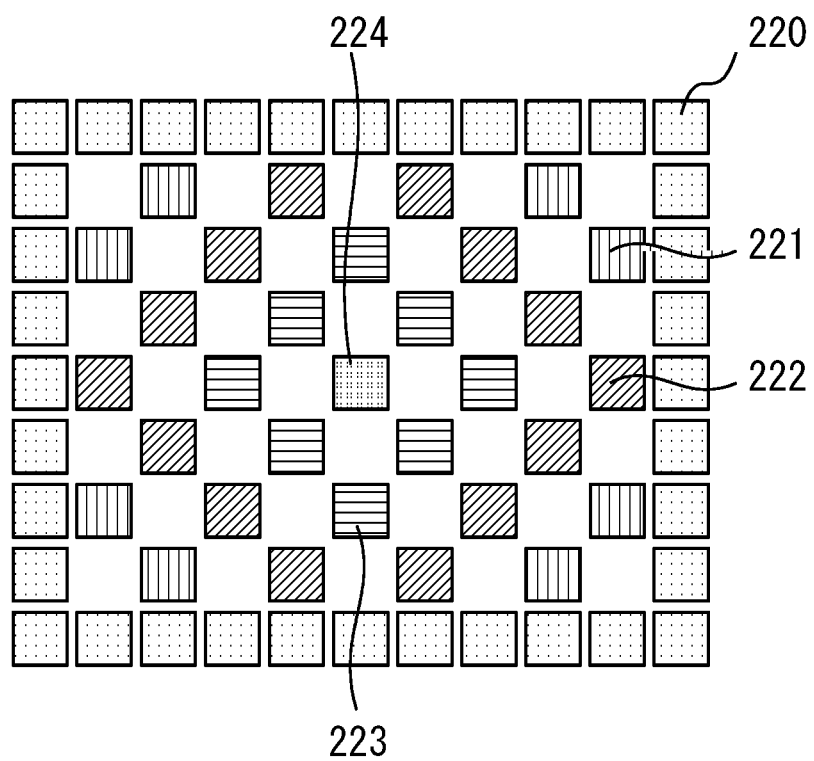
FIG. 15 is a plan view illustrating a modification according to the fourth embodiment of the present disclosure.

FIGS. 14 and 15 are plan views illustrating a modification according to the fourth embodiment of the present disclosure. FIG. 14 illustrates a modification using blocks other than blocks contacting proximate to an outer periphery, corner portions and the vicinity of diagonal line of a semiconductor chip 1. However, a block 215 contacting the center of the semiconductor chip 1 is used. As a result, a contact area between the semiconductor chip 1 and the entire blocks is reduced, whereby detachment from a dicing tape is easily promoted. Specifically, blocks 210 are not used, and blocks 211, 212, 213, 214, and 215 are pushed up to start detachment from the dicing tape. The blocks 211, 212, 213, 214, and 215 stop rising in this order, to advance the detachment.

FIG. 15 illustrates a modification using every other block contacting to semiconductor chip 1, excluding blocks proximate to an outer periphery and corner portions of a semiconductor chip 1. As a result, a contact area between the semiconductor chip 1 and the entire blocks is further reduced, whereby detachment from a dicing tape is easily promoted. Specifically, blocks 220 are not used, and blocks 221, 222, 223, and 224 are pushed up to start detachment from the dicing tape. The blocks 221, 222, 223, and 224 stop rising in this order, to advance the detachment.

The block pushed up illustrated in the present disclosure may be made of metal or resin. If the block is made of metal, the block has a long lifetime because it does not wear, also leading to prevention of cracking of the semiconductor chip due to a change in shape. If the block is made of resin, the block is low in material cost, whereby a reduction in cost can be implemented. The semiconductor manufacturing apparatus according to the present disclosure may have a configuration in which a plurality of semiconductor chips is simultaneously pushed up for the purpose of improving a processing capability.

The block pushed up illustrated in the present disclosure may have a lifting and lowering mechanism capable of changing a rise speed and a pushing-up amount. If adhesion of the dicing tape is strong, the rise speed is delayed to reduce a risk of cracking and chipping the semiconductor chip, and the pushing-up amount is increased to easily advance detachment from the dicing tape. On the other hand, if the adhesion is weak, the rise speed is increased to shorten a process time period, and the pushing-up amount is reduced to reduce the risk of cracking and chipping the semiconductor chip.

Further, although the present disclosure illustrates a case where a substrate formed of silicon is used, a wide band gap semiconductor having a larger band gap than that of silicon may be used. An example of the wide band gap semiconductor is silicon carbide, a gallium nitride-based material, or diamond.

Obviously many modifications and variations of the present disclosure are possible in the light of the above teachings. It is therefore to be understood that within the scope of the appended claims the invention may be practiced otherwise than as specifically described.

The entire disclosure of a Japanese Patent Application No. 2021-206231, filed on Dec. 20, 2021 including specification, claims, drawings and summary, on which the Convention priority of the present application is based, are incorporated herein by reference in its entirety.

The invention claimed is:

1. A semiconductor manufacturing apparatus comprising:
a pickup stage having a mechanism for lifting and lowering a semiconductor chip having a square shape, wherein
the pickup stage comprises first pushing-up blocks at four corners thereof, and
each of the first pushing-up blocks comprises
a first side configured to be parallel to one side of the square semiconductor chip with the square semiconductor chip placed on the apparatus,
a second side configured to be parallel to another side of the square semiconductor chip with the square semiconductor device placed on the apparatus, and
an offset portion formed between the first side and the second side to be offset to an inward side of an intersection point of respective extension lines of the first side and the second side.

2. The semiconductor manufacturing apparatus according to claim 1, wherein the offset portion is concave toward the inward side of the intersection point of the extension lines of the first and second sides.

3. The semiconductor manufacturing apparatus according to claim 1, wherein each of the first pushing-up blocks has a surface inclined such that a height of each block decreases in a direction towards a center of an arrangement of the first pushing-up blocks.

4. The semiconductor manufacturing apparatus according to claim 1, wherein an upper surface of each of the first pushing-up blocks has an uneven shape.

5. The semiconductor manufacturing apparatus according to claim 4, wherein the uneven shape is a shape including any one of a concave portion formed by a slit, a convex portion formed by a spherical shape or a convex portion formed by a needle-shaped member.

6. The semiconductor manufacturing apparatus according to claim 1, wherein the pickup stage includes a second pushing-up block that operates inside the first pushing-up blocks and in cooperation with the first pushing-up blocks.

7. The semiconductor manufacturing apparatus according to claim 6, wherein each of the first pushing-up blocks has an elastic function in an inner portion thereof.

8. The semiconductor manufacturing apparatus according to claim 7, wherein an upper surface of the second pushing-up block has a shape such that, with the square semiconductor chip placed on the apparatus, the second pushing-up block supports a vicinity of a center of each side of the square semiconductor chip.

9. The semiconductor manufacturing apparatus according to claim 7, wherein an upper surface of the second pushing-up block is a curved surface inclined such that a central portion of the second pushing-up block is highest.

10. The semiconductor manufacturing apparatus according to claim 6, wherein an upper surface of the second pushing-up block has a shape that supports a vicinity of a center of each side of the semiconductor chip.

11. The semiconductor manufacturing apparatus according to claim 10, wherein an upper surface of the second pushing-up block is a curved surface inclined such that a central portion of the second pushing-up block is highest.

12. The semiconductor manufacturing apparatus according to claim 6, wherein an upper surface of the second pushing-up block is a curved surface inclined such that a central portion of the second pushing-up block is highest.

13. The semiconductor manufacturing apparatus according to claim 6, wherein the second pushing-up block includes a plurality of blocks, and the plurality of blocks sequentially operate to increase in height toward an inner side.

14. The semiconductor manufacturing apparatus according to claim 1, wherein the pickup stage comprises a suction mechanism.

15. The semiconductor manufacturing apparatus according to of claim 1, wherein the semiconductor chip is formed of a wide band gap semiconductor.

16. The semiconductor manufacturing apparatus according to claim 15, wherein the wide band gap semiconductor is silicon carbide, a gallium nitride-based material, or diamond.

* * * * *